(12) United States Patent
Geyer et al.

(10) Patent No.: US 6,472,130 B1
(45) Date of Patent: Oct. 29, 2002

(54) SOLUTION OF TETRAMETHYLAMMONIUM HYDROXIDE IN WATER AND A PROCESS FOR PREPARING THE SOLUTION

(75) Inventors: Stefan Geyer, Dresden; Michael Horn, Ottobrunn, both of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/581,670
(22) PCT Filed: Dec. 11, 1998
(86) PCT No.: PCT/DE98/03649
§ 371 (c)(1),
(2), (4) Date: Oct. 16, 2000
(87) PCT Pub. No.: WO99/30210
PCT Pub. Date: Jun. 17, 1999

(30) Foreign Application Priority Data

Dec. 11, 1997 (DE) .......................... 197 55 131

(51) Int. Cl.⁷ ................................. G03F 7/32
(52) U.S. Cl. ....................................... 430/331

(58) Field of Search .......................... 430/331

(56) References Cited

U.S. PATENT DOCUMENTS

| 4,847,182 A | 7/1989 | Worns et al. ............... 430/309 |
| 5,292,626 A | 3/1994 | Buhr et al. ................. 430/331 |

FOREIGN PATENT DOCUMENTS

| DE | 37 23 429 A1 | 1/1988 |
| EP | 0 364 895 A1 | 4/1990 |
| EP | 0 474 010 A1 | 3/1992 |
| JP | 7305093 | * 11/1995 |

* cited by examiner

*Primary Examiner*—Hoa Van Le
(74) *Attorney, Agent, or Firm*—Laurence A. Greenberg; Werner H. Stemer; Gregory L. Mayback

(57) ABSTRACT

A solution of tetramethylammonium hydroxide in water comprises a surfactant component and a hydrotropic component. A process for preparing a solution for developing an exposed photoresist comprises the steps: preparation of a solution of tetramethylammonium hydroxide in water; addition of a surfactant component; and addition of a hydrotropic component.

21 Claims, No Drawings

SOLUTION OF TETRAMETHYLAMMONIUM HYDROXIDE IN WATER AND A PROCESS FOR PREPARING THE SOLUTION

BACKGROUND OF THE INVENTION

Field of the Invention

The invention relates to a solution of tetramethylammonium hydroxide in water with a surfactant component, and to a process for preparing a solution for developing an exposed photoresist.

In wafer production, a photoresist mask is applied to the wafer, exposed and then developed using a developer liquid. A conventional developer is based on a 2.5% strength solution of tetramethylammonium hydroxide (TMAH) in water, comprising a small amount of added surfactant. The surfactant is able to reduce the interfacial tension of the developer solution to an appropriate, defined value.

The amount of developer solution required in a wafer factory is considerable: the development of a photoresist mask on a single wafer requires about 50 ml of developer solution. Currently, the production of a finished wafer comprises about 20 lithography steps which means that it is also necessary to carry out 20 development steps. A wafer factory producing 10,000 wafers per week requires approximately 10,000 liters of developer liquid a week. The transport of the developer liquid to the factory thus gives rise to considerable costs.

It has been suggested that a more highly concentrated TMAH solution (for example 25% strength) be transported to the factory and diluted in the factory itself to give the desired final concentration. The deionized, high-purity water required for this purpose is available in all wafer factories. A reduction of transport costs would be achieved by this measure.

There is, however, a practical problem in that the surfactant does not dissolve in such a concentrated developer solution at standard temperature. The surfactant precipitates in the concentrated solution, i.e. it forms insoluble aggregates, which may form deposits on container walls. For this reason it is not possible to transport the surfactant in a concentrated TMAH solution.

It would be possible in principle to transport the developer solution to the factory in concentrated form without surfactant and add the surfactant only after diluting the developer solution to its final use concentration (approximately 2.5%). However, this procedure would involve transporting the surfactant to the factory separately in prediluted form and require an extra addition step in addition to diluting with water, which extra step is risky in terms of purity requirements. However, the essential disadvantage of this method is that is is usually not possible in a wafer factory to monitor and control the amount of admixed surfactant in a sufficiently exact manner. These disadvantages are so serious that this procedure is not used in practice.

SUMMARY OF THE INVENTION

The first object is achieved, according to the invention, in that the solution further comprises a hydrotropic component.

The object of the present invention is to provide a developer solution which reduces the costs associated with the development step in wafer production. It is another object of the present invention to provide a process for preparing such a solution.

The first object is achieved according to the invention by the characterizing features of Claim 1.

The solution according to the invention has the advantage that it can be both in a concentrated form which is particularly suitable for transport purposes, and in a ready-to-use, low-concentration form.

In the concentrated form, for example at a TMAH concentration of 5–40% and in particular of 25%, the effect of the hydrotropic component is that the surfactant component is soluble even at these increased TMAH concentrations. It is thus possible to transport the TMAH solution of the invention in its concentrated form, correspondingly reducing the amount of solution to be transported and thus the transport costs.

The novel ready-to-use developer solution, having a TMAH concentration of approximately 2,5%, can be obtained by simple dilution of the concentrated TMAH solution with deionized, high-purity water. It was found that the hydrotropic component does not impair the development behavior of the solution.

The hydrotropic component preferably consists of cumenesulfonic acid, tetramethylammonium cumenesulfonate, tetramethylammonium xylenesulfonate, tetramethylammonium toluenesulfonate, tetramethylammonium phenolsulfonate and/or tetramethylammonium benzenesulfonate.

The second object of the present invention is achieved, according to the invention, by adding a hydrotropic component.

For the preparation of a concentrated novel solution intended for transport, the novel process is characterized in that step b) comprises adding the surfactant component in a concentration above the cloud point and step c) comprises adding the hydrotropic component in an amount sufficient to solubilize the surfactant component added in step b). The surfactant and the hydrotrope can be added in any sequence.

Advantageous embodiments of the invention are specified in the dependent claims.

The invention will now be described by way of example with reference to illustrative embodiments.

EXAMPLES

The invention will now be described by way of example with reference to illustrative embodiments.

In a first illustrative embodiment, 100 g of a 25% strength TMAH solution are admixed with 1 g of random n-dodecanol pentaethoxylate $CH_3-(CH_2-)_{10}CH_2-O-(CH_2-CH_2-O-)_5H$ which acts as a surfactant. The tenside precipitates and a cloudy solution is formed with stirring. 1.2 g of cumenesulfonic acid solubilizer (hydrotrope) are then added. With stirring, the solution becomes clear at room temperature. The solution has a cloud point, which is referred to as Krafft point and is is temperature-dependent, of 33° C. This means that the solution is stable, in its concentrated form, up to a temperature of 33° C.

If 1.7 g of cumenesulfonic acid are added instead of 1.2 g of cumenesulfonic acid, the cloud point is raised to 55° C.

A ready-to-use developer solution is prepared by 10-fold dilution of the solution with water.

In a second illustrative embodiment, 100 g of a 25% strength TMAH solution are admixed with 1 g of random nonylphenol octadecaethoxylate $CH_3-(CH_2-)_9C_6H_4-O-(CH_2-CH_2-O-)_{18}H$ which acts as a surfactant. The tenside precipitates and a cloudy solution is formed with stirring. 1.25 g of cumenesulfonic 30 acid solubilizer (hydrotrope) are then added. With stirring, the solution becomes. The solution has a cloud point of 35° C.

If 1.70 g of tetramethylammonium cumenesulfonate $(CH_3)_4$—N+—$SO_3$—$C_6H_4$—CH—$(CH_3)_2$ are added in the form of a concentrate dissolved in water instead of 1.25 g of cumenesulfonic acid, the solution likewise has a cloud point of 35° C.

A ready-to-use developer solution is again prepared by 10-fold dilution of the solution with water. The behavior of this solution in the development process is not impaired by the hydrotrope added. In the case of tetramethylammonium cumenesulfonate as hydrotrope, this is due to the fact that the alkyl group on the aromatic ring of the tetramethylammonium cumenesulfonate is too short to exhibit any surface activity in a 2.5% strength TMAH solution.

All above described illustrative embodiments have in common that the addition of a hydrotrope in a sufficient amount reliably prevents phase separation in a concentrated TMAH solution comprising a surfactant component, which makes it possible to keep the surfactant in a stable and clear solution even in the concentrated TMAH solutions (for example 25% strength). This allows the preparation of the ready-to-use developer solution by on-site dilution of the concentrated TMAH solution in the wafer factory which leads to a significant reduction in transport costs.

What is claimed is:

1. A concentrated developer solution, adapted for dilution with water to a use concentration, comprising: a base component of water, a component of tetramethylammonium hydroxide, a surfactant component, and a hydrotropic component in the solution, wherein said hydrotropic component comprises at least one material selected from the group consisting of cumenesulfonic acid, tetramethylammonium cumenesulfonate, tetramethylammonium xylenesulfonate, tetramethylammonium phenolsulfonate, tetramethylammonium toluenesulfonate, and tetramethylammonium benzenesulfonate.

2. The solution according to claim 1, wherein the concentration of tetramethylammonium hydroxide in said solution is a 5–40%.

3. The solution according to claim 1, wherein the concentration of tetramethylammonium hydroxide in said solution is substantially a 25%.

4. A developer solution comprising a solution according to claim 1 and additional water to dilute said solution to a 2–5% strength solution of tetramethylammonium hydroxide in water.

5. The solution according to claim 1, having a cloud point of 33° C. minimum.

6. The solution according to claim 1, wherein said surfactant component is nonionic.

7. The solution according to claim 1, wherein the concentration of said surfactant component is 1%.

8. The solution according to claim 1, wherein the concentration of said hydrotropic component is in the range from 1.2% to 1.7%.

9. The solution according to claim 1, wherein said hydrotropic component is cumenesulfonic acid.

10. The solution according to claim 1, wherein said hydrotropic component is tetramethylammonium cumenesulfonate.

11. The solution according to claim 1, wherein said solution is substantially free of inorganic ions.

12. A process for preparing a concentrated developer solution, adapted for dilution with water to a use concentration, which comprises the following steps:

a) preparing a solution of tetramethylammonium hydroxide in water;

b) adding a surfactant component to the solution; and c) adding a hydrotropic component to the solution, wherein the hydrotropic component includes at least one material selected from the group consisting of cumenesulfonic acid, tetramethylammonium cumenesulfonate, tetramethylammonium xylenesulfonate, tetramethylammonium phenolsulfonate and tetramethylammonium benzenesulfonate.

13. The process according to claim 12, wherein step b) comprises adding the surfactant component in a concentration above a cloud point, and step c) comprises adding the hydrotropic component in an amount sufficient for solubilizing the surfactant component added in step b).

14. The process according to claim 12, wherein step a) comprises forming a 5–40% strength solution of tetramethylammonium hydroxide in water.

15. The process according to claim 12, wherein step a) comprises forming a substantially 25% strength solution of tetramethylammonium hydroxide in water.

16. The process according to claim 12, which further comprises: d) diluting the solution with deionized water to achieve a tetramethylammonium hydroxide concentration rendering the solution suitable as a developer solution in a photoresist development step.

17. The process according to claim 16, which comprises forming the diluted solution with a tetramethylammonium hydroxide concentration of 2–5 in water.

18. The process according to claim 16, which comprises forming the diluted solution with a tetramethylammonium hydroxide concentration of approximately 2.5 in water.

19. The process according to claim 12, which comprises selecting the surfactant component from the group consisting of dodecanol pentaethoxylate and nonylphenol octadecaethoxylate.

20. The developer solution according to claim 4, wherein said solution is substantially a 2.5% strength solution of tetramethyl-ammonium hydroxide in water.

21. The solution according to claim 6, wherein said surfactant component includes at least one of dodecanol pentaethoxylate and nonylphenol octadecaethoxylate.

* * * * *